(12) United States Patent
Engelhardt et al.

(10) Patent No.: US 7,321,097 B2
(45) Date of Patent: Jan. 22, 2008

(54) ELECTRONIC COMPONENT COMPRISING AN ELECTRICALLY CONDUCTIVE CONNECTION CONSISTING OF CARBON NANOTUBES AND A METHOD FOR PRODUCING THE SAME

(75) Inventors: Manfred Engelhardt, Feldkirchen-Westerham (DE); Wolfgang Hönlein, Unterhaching (DE); Franz Kreupl, München (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/204,180

(22) PCT Filed: Feb. 2, 2001

(86) PCT No.: PCT/DE01/00419

§ 371 (c)(1),
(2), (4) Date: Nov. 13, 2002

(87) PCT Pub. No.: WO01/61753

PCT Pub. Date: Aug. 23, 2001

(65) Prior Publication Data

US 2003/0179559 A1 Sep. 25, 2003

(30) Foreign Application Priority Data

Feb. 16, 2000 (DE) ................................ 100 06 964

(51) Int. Cl.
*H01R 12/04* (2006.01)
*H05K 1/11* (2006.01)

(52) U.S. Cl. ........................ 174/256; 174/262; 361/803

(58) Field of Classification Search ................ 174/256, 174/260, 261–266; 361/751, 777–779, 803
See application file for complete search history.

(56) References Cited

U.S. PATENT DOCUMENTS 5,192,835 A * 3/1993 Bull et al. ................... 174/260
5,712,607 A * 1/1998 Dittmer et al. .............. 333/238
5,818,700 A 10/1998 Purinton
6,019,656 A * 2/2000 Park et al. ..................... 445/24
6,242,808 B1 6/2001 Shimizu et al.
6,297,063 B1 10/2001 Brown et al.
2001/0023986 A1* 9/2001 Mancevski .................. 257/741

FOREIGN PATENT DOCUMENTS

| EP | 0 726 621 A2 | 8/1996 |
| EP | 0 913 508 A2 | 5/1999 |
| EP | 0 918 354 A2 | 5/1999 |
| EP | 0949673 A2 | 10/1999 |
| EP | 0949673 A3 | 2/2002 |
| JP | 11-139815 | 5/1999 |
| JP | 11-297696 | 10/1999 |
| JP | 11-330244 | 11/1999 |
| JP | 2001-177052 | 6/2001 |

OTHER PUBLICATIONS

Martin, C., Template Synthesis of Polymeric and Metal Microtubules, Advanced Materials, No. 9, pp. 457-459, Sep. 1991.
Jung Sang Suh and Jin Seung Lee, Highly Ordered Two-Dimensional Carbon Nanotubes Areas, Applied Physics Letters, vol. 75, No. 14, pp. 2047-2049, Oct. 1999.
Dekker, C., Carbon Nanotubes As Molecular Quantum Wires, Physics Today, pp. 22-28, May 1999.

* cited by examiner

*Primary Examiner*—Tuan T. Dinh
*Assistant Examiner*—Jeremy C Norris
(74) *Attorney, Agent, or Firm*—Altera Law Group, LLC (57) ABSTRACT

The invention provides in a preferred embodiment an electronic component comprising a first conductive layer, a non-conductive layer and a second conductive layer. A hole is etched through the non-conductive layer. A nanotube, which is provided in said hole, links the first conductive layer to the second conductive layer in a conductive manner.

10 Claims, 15 Drawing Sheets

ELECTRONIC COMPONENT COMPRISING AN ELECTRICALLY CONDUCTIVE CONNECTION CONSISTING OF CARBON NANOTUBES AND A METHOD FOR PRODUCING THE SAME

The invention relates to an electronic component, to a method for producing a conductive connection in an electronic component and to a method for producing an electronic component.

In an electronic component which is of integrated design, it is customary for two conductive layers which are electrically insulated by a conductive layer to be connected to one another in an electrically conductive manner by etching a hole through the nonconductive layer. The hole is filled with metal, resulting in a metallic contact which connects the two conductive layers to one another in an electrically conductive manner.

A drawback of this procedure is that, particularly as the lateral dimensions decrease, i.e. as the diameter of a contact hole through the nonconductive layer decreases and the vertical extent increases, or at least with an increasing aspect ratio, filling the contact hole with metal causes problems and is prone to defects. In particular, the deposited metal often causes a blockage in the upper region of the contact hole, preventing the entire contact hole from being filled with metal. Therefore, it is often impossible to produce an electrically conductive connection between the two conductive layers. Moreover, an incompletely filled contact hole leads to reliability problems.

A further drawback of the known procedure is that in the case of a contact hole with a very low aspect ratio, the conductivity of the metallic contact decreases considerably, i.e. the metallic contact represents an element which imposes considerable limitations with regard to the scaling of a metallization system and therefore an integrated circuit, in which it is necessary for a plurality of conductive layers to be electrically conductively connected to one another through nonconductive layers in the vertical direction of an electronic component.

Furthermore, [1] has disclosed basic principles of what are known as carbon nanotubes as a highly conductive material whose conductivity greatly exceeds the conductivity of metal of the same dimensions.

[2] has disclosed a process for growing carbon nanotubes in a perforated dialuminum trioxide matrix ($Al_2O_3$ matrix) in a self-aligned manner.

Therefore, the invention is based on the problem of providing a conductive connection in an electronic component and of proving an electronic component having a conductive connection between two conductive layers which are insulated from one another by a nonconductive layer, in which it is possible to produce a conductive connection even with holes with a very high aspect ratio.

The problem is solved by an electronic component, by a method for producing a conductive connection in an electronic component and by a method for producing an electronic component having the features described in the independent patent claims.

An electronic component includes a first conductive layer, a conductive layer on the first conductive layer and a second conductive layer on the nonconductive layer. At least one hole which passes all the way through the nonconductive layer is provided in the nonconductive layer. The hole holds at least one nanotube, by which the first conductive layer is conductively connected to the second conductive layer.

In a method for producing a conductive connection in an electronic component, a nonconductive layer is deposited above a first conductive layer. A hole is produced through the nonconductive layer, and at least one nanotube is grown in the holes. Then, a second conductive layer is deposited, in such a manner that the first conductive layer is conductively connected to the second conductive layer by the nanotube.

In a method for producing an electronic component, in a first step a first conductive layer is provided. A nonconductive layer is deposited above the first conductive layer, and a hole is produced through the nonconductive layer, for example by etching. At least one nanotube is grown in the hole, and a second conductive layer is deposited in such a manner that the first conductive layer is conductively connected to the second conductive layer by the nanotube.

The invention makes it possible to create a reliable, electrically conductive connection between two conductive layers even in the case of contact holes with a very small diameter and a high aspect ratio. The conductive layers may, for example, be any metallic conductive material, such as for example copper, aluminum, silver, etc., it usually being possible for the conductive layers to include a bonding, diffusion and anti-reflection layer, including, for example, Ti, TiN, Ta, TaN, and/or a combination of these materials. The electrically non-conductive layer may be an intermetal dielectric, such as for example silicon oxide or silicon nitride, or another insulating layer made from inorganic material, such as for example polyimide or any desired combination thereof. The electrically conductive connection by means of at least one nanotube is limited only by the diameter of a nanotube of this type, which in the case of a carbon nanotube is approximately 1.5 nm.

The production method is distinguished by its simplicity and robustness, i.e. by a low susceptibility to faults, and by the fact that an electrically conductive connection is produced reliably.

Therefore, the electronic components can be produced easily and inexpensively even with very fine structures, i.e. with a small contact hole diameter.

Preferred refinements of the invention will emerge from the dependent claims.

According to a preferred configuration of the invention, the nanotube is a carbon nanotube.

A carbon nanotube of this type can be produced in self-aligned fashion very easily and reliably even in a contact hole of small diameter.

Furthermore, the carbon nanotube has a very high conductivity, which considerably exceeds the conductivity of even the best metallic conductors, such as for example, copper or silver, for the same dimensions.

A plurality of nanotubes, in principle any desired number of nanotubes, may be present in a contact hole of this type, in order for the two conductive layers to be electrically connected to one another.

According to one configuration of the invention, a nucleation layer, which preferably has metal particles which are catalytically active for a growing nanotube, for example metal particles comprising nickel and/or iron, and/or yttrium, and/or cobalt and/or platinum, is provided in the contact hole above the first conductive layer in order to accelerate the growth of the nanotube.

The hole can be etched through the nonconductive layer.

Although the exemplary embodiments which are described below each describe a semiconductor element, it should be noted that the invention is in no way restricted to a semiconductor element, but rather can be used in any electronic component in which two conductive layers which are electrically isolated by a nonconductive layer are to be conductively connected to one another, irrespective of whether or not a layer is a semiconductor layer. In particular, the invention is suitable for use in the context of an integrated circuit.

Exemplary embodiments of the invention are illustrated in the figures and are explained in more detail below. In the drawing.

EXEMPLARY EMBODIMENT 1

Figure 1:
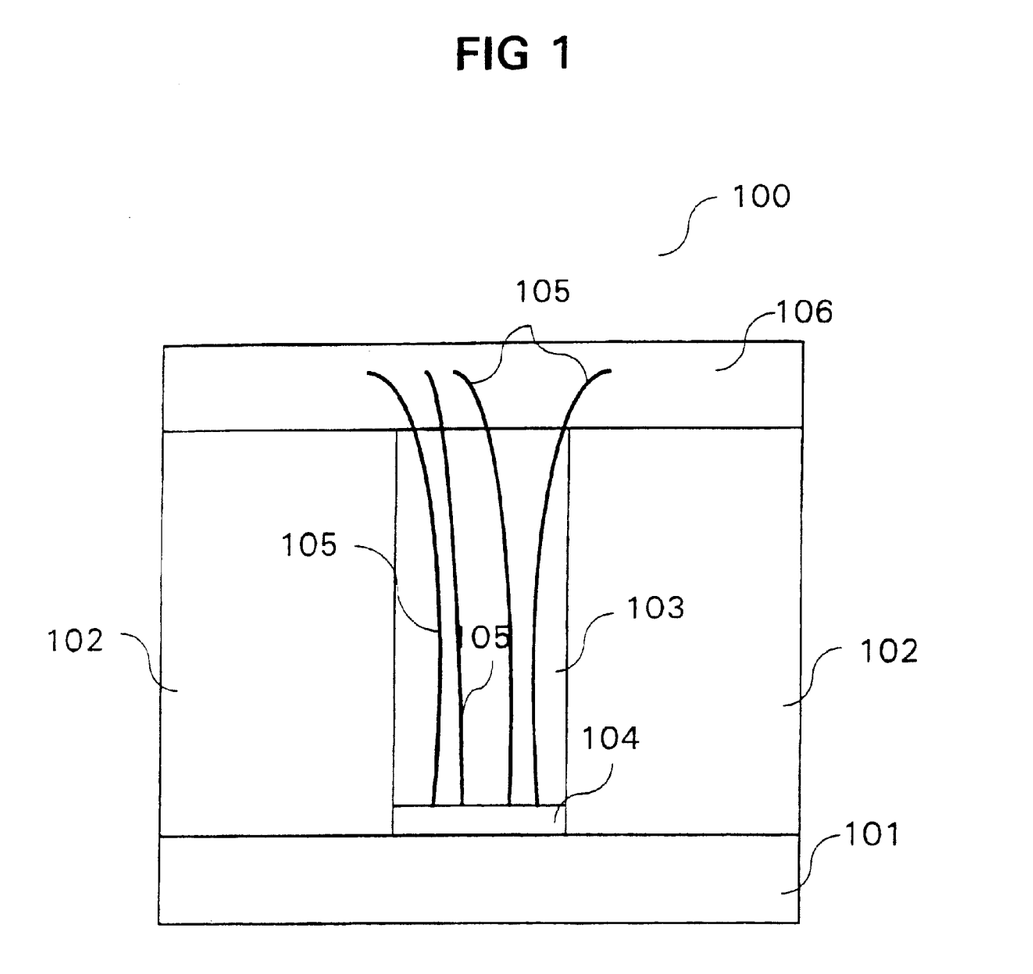
FIG. 1 shows a cross section through a semiconductor element in accordance with a first exemplary embodiment.

FIG. 1 shows a first semiconductor element 100 in accordance with a first exemplary embodiment.

The first semiconductor element 100 has a first conductive layer 101 comprising copper or aluminum, with a bonding, diffusion and anti-reflection layer, including, for example, Ti, TiN, Ta, TaN, and/or a combination of these materials. A nonconductive layer 102 comprising an intermetal dielectric, according to the first exemplary embodiment comprising silicon dioxide, is deposited on the first conductive layer 101.

A contact hole 103 is etched into the nonconductive layer 102, and a nucleation layer 104 is deposited at the bottom of the contact hole, i.e. on top of the fist conductive layer 101.

The nucleation layer 104 is a layer of catalytically active metal particles, for example comprising nickel, iron, yttrium, cobalt and/or platinum. The nucleation layer 104 has a catalytic effect for the growth of a carbon nanotube.

In principle any desired number of carbon nanotubes 105 has been grown on top of the nucleation layer 104.

A second conductive layer 106, comprising a sequence of Ti, TiN, Ta, TaN and/or copper and/or aluminum is deposited above the nonconductive layer 102, in such a manner that the carbon nanotubes 105 are electrically conductively connected to the second conductive layer 106.

The individual method steps involved in the production of the first semiconductor element 100 are explained in more detail with reference to FIG. 2a to FIG. 2d.

Figure 2A:
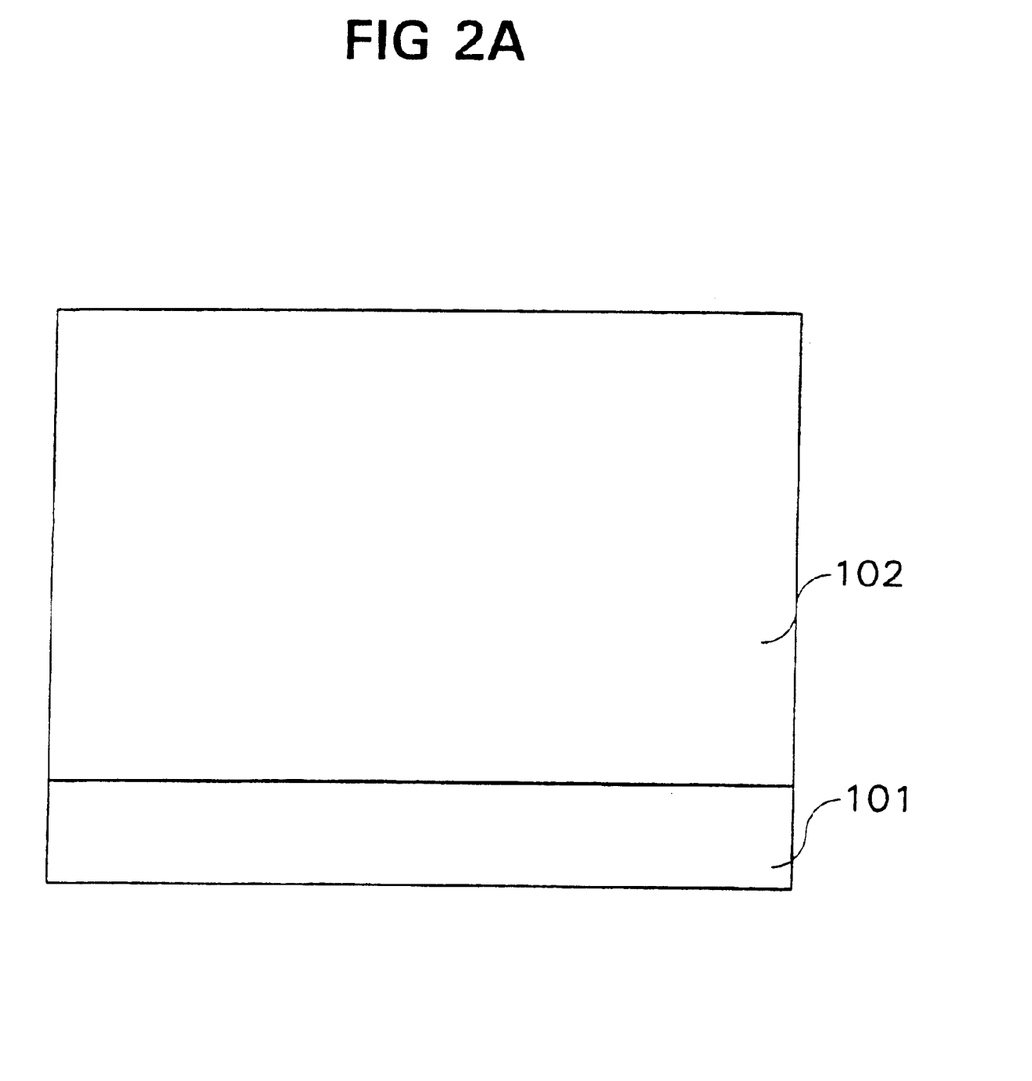
FIGS. 2a to 2d show cross sections through a semiconductor element, on the basis of which the individual method steps involved in the production of the semiconductor element illustrated in FIG. 1 is explained.

In a first step, the nonconductive layer 102 is deposited on the first conductive layer 101, for example by means of a vapor deposition process (Chemical Vapor Deposition process, CVD process) (cf. FIG. 2a).

Figure 2B:
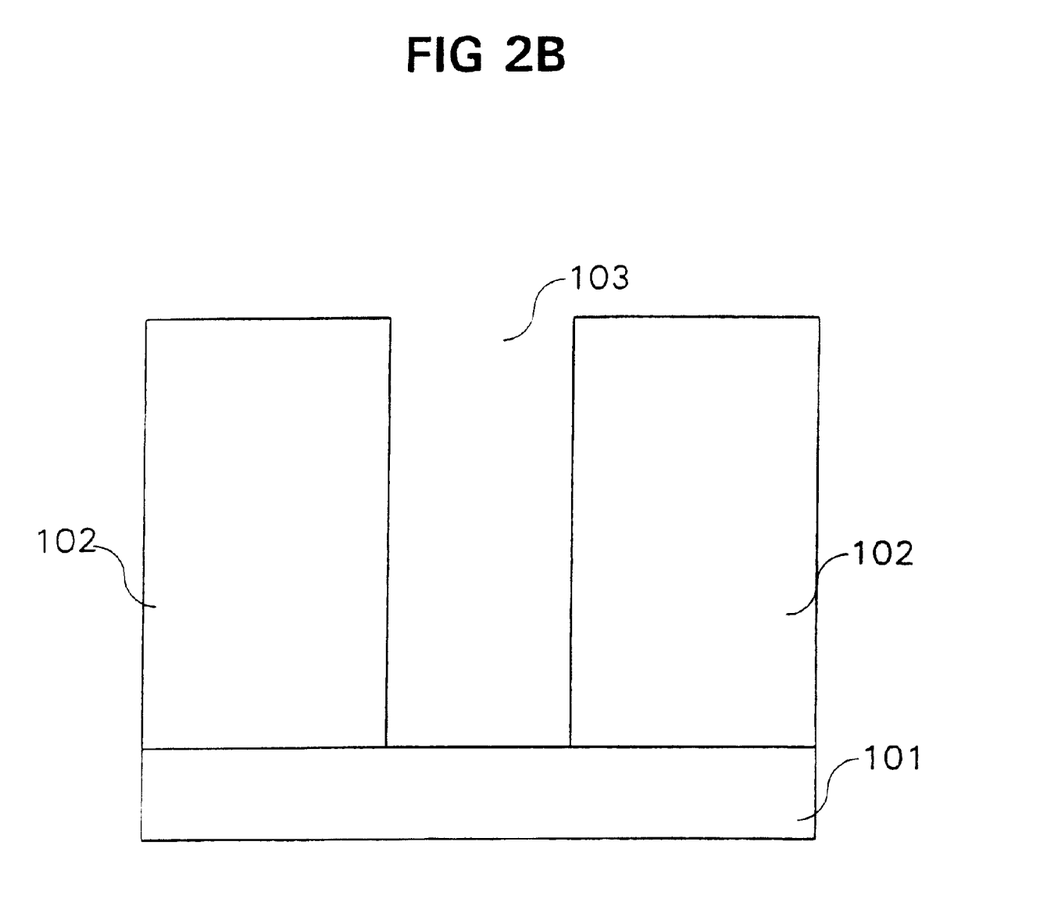

By suitable masking of the nonconductive layer 102, wet-etching or dry-etching of the nonconductive layer 102, the hole (contact hole) 103 is etched through the nonconductive layer 102 down to the surface of the first conductive layer 101 (cf. FIG.2b).

The nucleation layer 104 is deposited in the hole 103 by means of a suitable process (cf. FIG. 2c), for example using a CVD process. The nucleation layer 104 has a thickness of 0.1 nm to 50 nm.

Figure 2C:
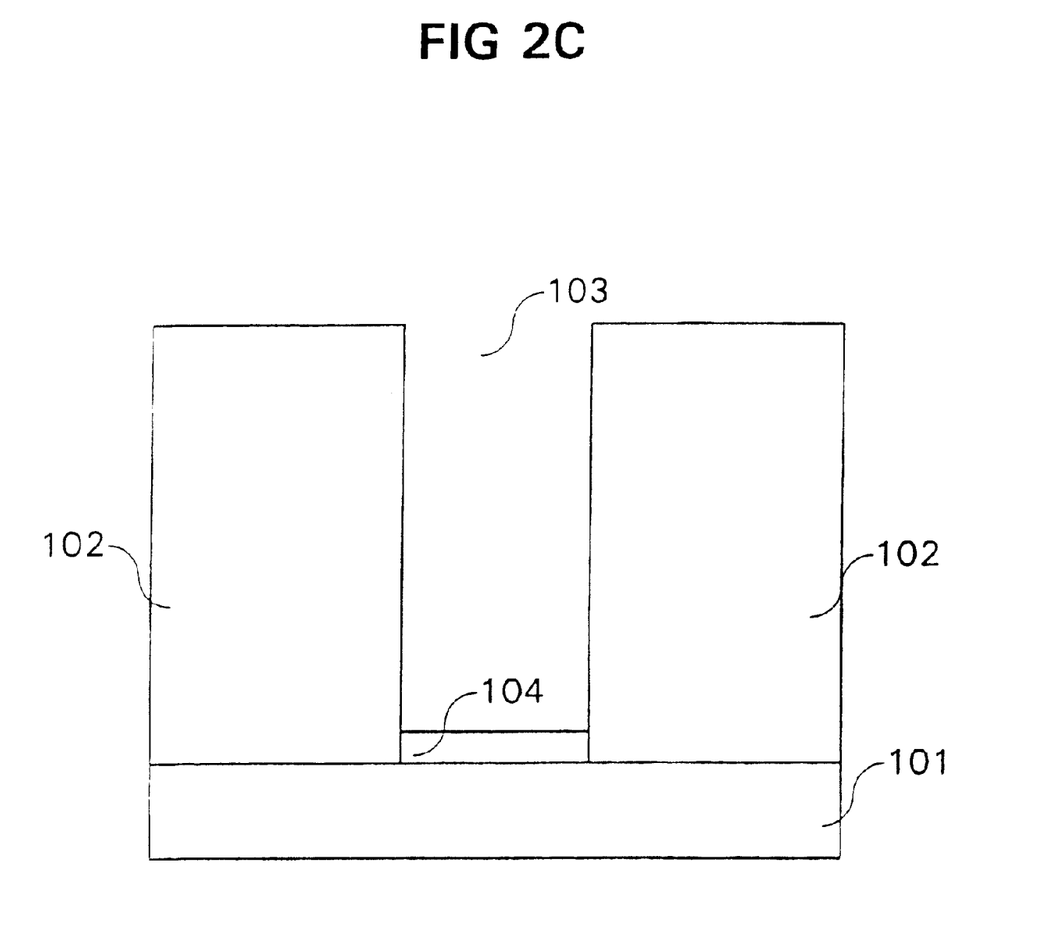

The nucleation layer 104 in accordance with the first exemplary embodiment is formed from nickel metal particles.

Figure 2D:
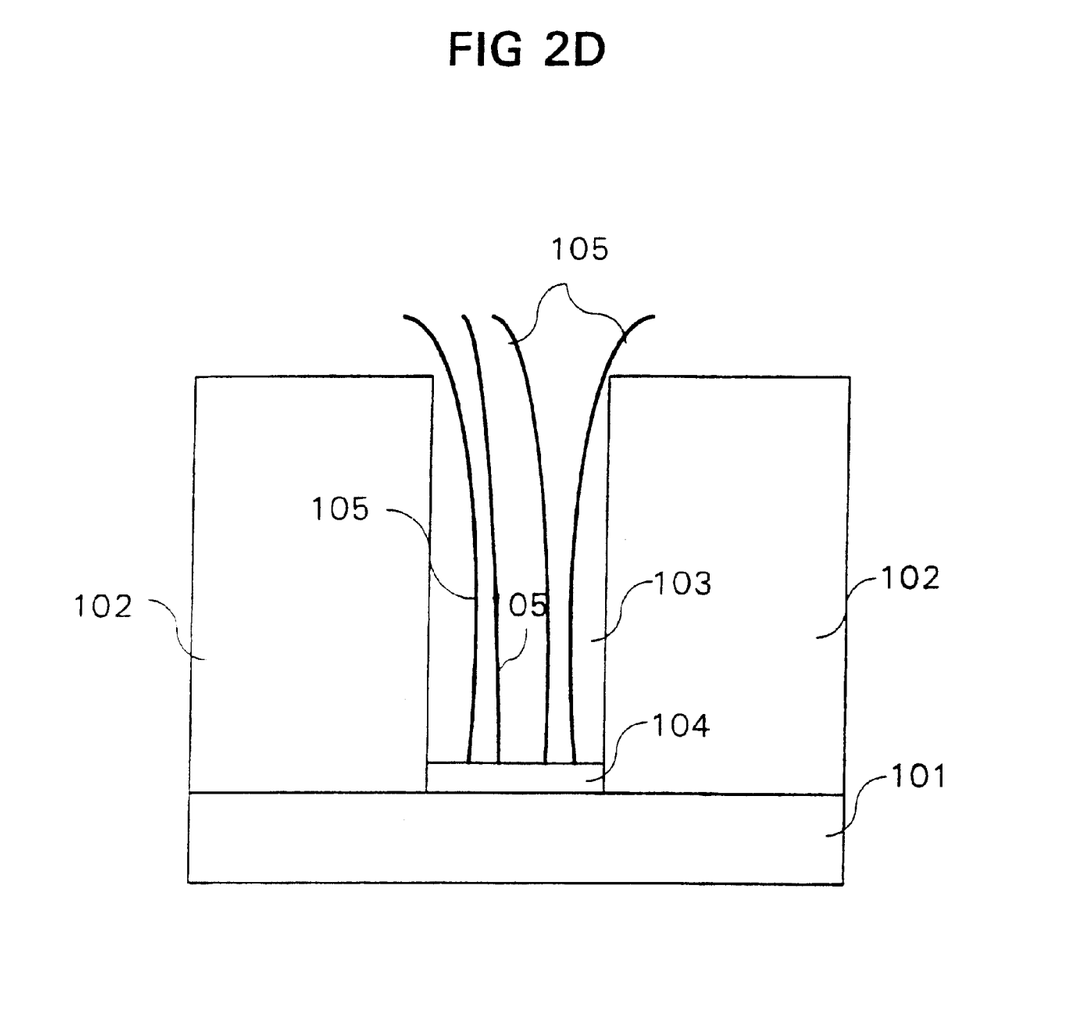

In a further step, carbon nanotubes 105 are grown on the nucleation layer 104 in the hole 103 using the process described in [2] (cf. FIG. 2d).

The length of the carbon nanotubes 105 is dependent on the time over which the carbon nanotubes are grown on the nucleation layer 104.

The carbon nanotubes 105 are grown until they project beyond the upper end of the nonconductive layer 102.

When this is the case, in a further step the second conductive layer 106 is deposited on the nonconductive layer 102 by means of a CVD process or a sputtering process or a physical vapor deposition process.

Since the carbon nanotubes 105 project beyond the nonconductive layer 102, they project directly into the second nonconductive layer 106. Final chemical mechanical polishing (CMP process) or ion-beam etching removes the second conductive layer 106 down to a desired thickness.

In this way, the carbon nanotubes 105 create an electrically conductive connection between the first conductive layer 101 and the second conductive layer 106 via the nucleation layer 104, which itself also contains conductive metal particles.

EXEMPLARY EMBODIMENT 2

Figure 3:
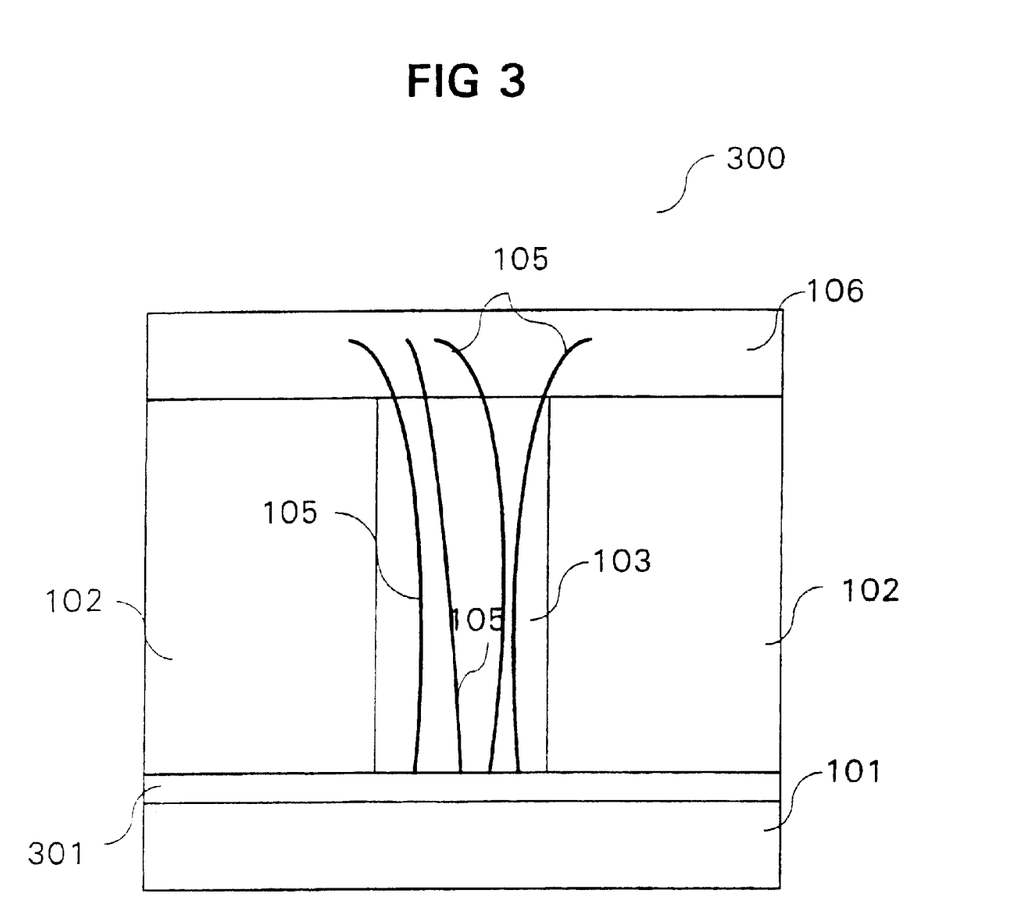
FIG. 3 shows a cross section through a semiconductor element in accordance with a second exemplary embodiment.

FIG. 3 shows a cross section through a second semiconductor element 300 in accordance with a second exemplary embodiment.

Identical elements in the figures are provided with the same reference symbols in the second exemplary embodiment as the elements in the first exemplary embodiment.

The second semiconductor element 300 has basically the same structure as the first semiconductor element 100, except that the nucleation layer 301 in accordance with the second exemplary embodiment extends not only over the base of the hole 103, but also over the entire first conductive layer 101.

The individual layers in accordance with the second exemplary embodiment comprise the same materials as the corresponding layers in accordance with the first exemplary embodiment.

Figure 4A:
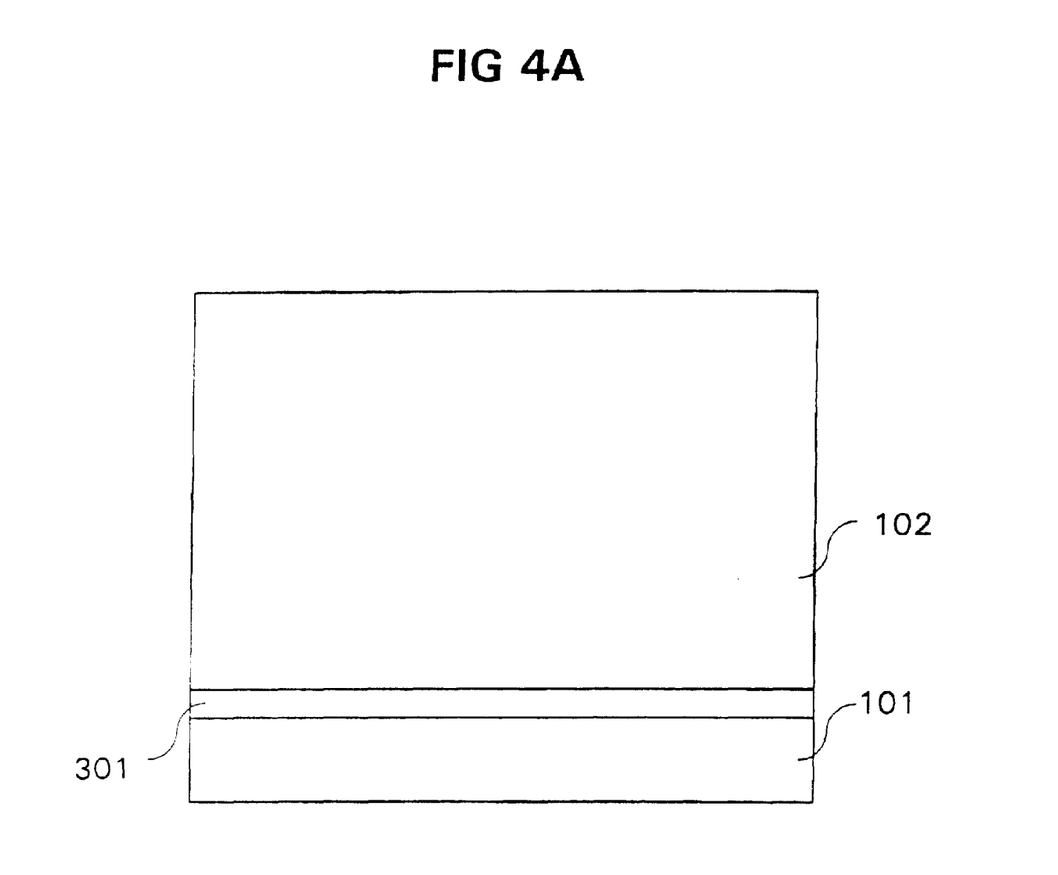
FIGS. 4a to 4c show cross sections through a semiconductor element which are used to explain the individual methods steps involved in the production of the semiconductor element illustrated in FIG. 3.
Figure 4B:
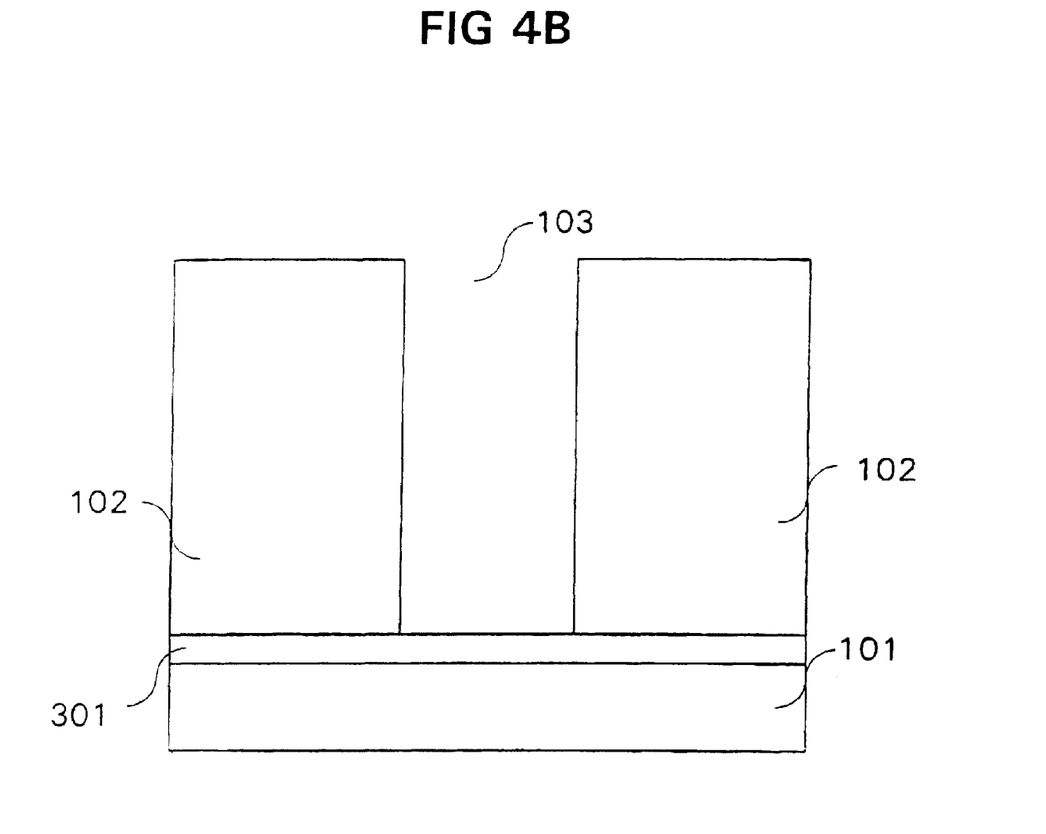
Figure 4C:
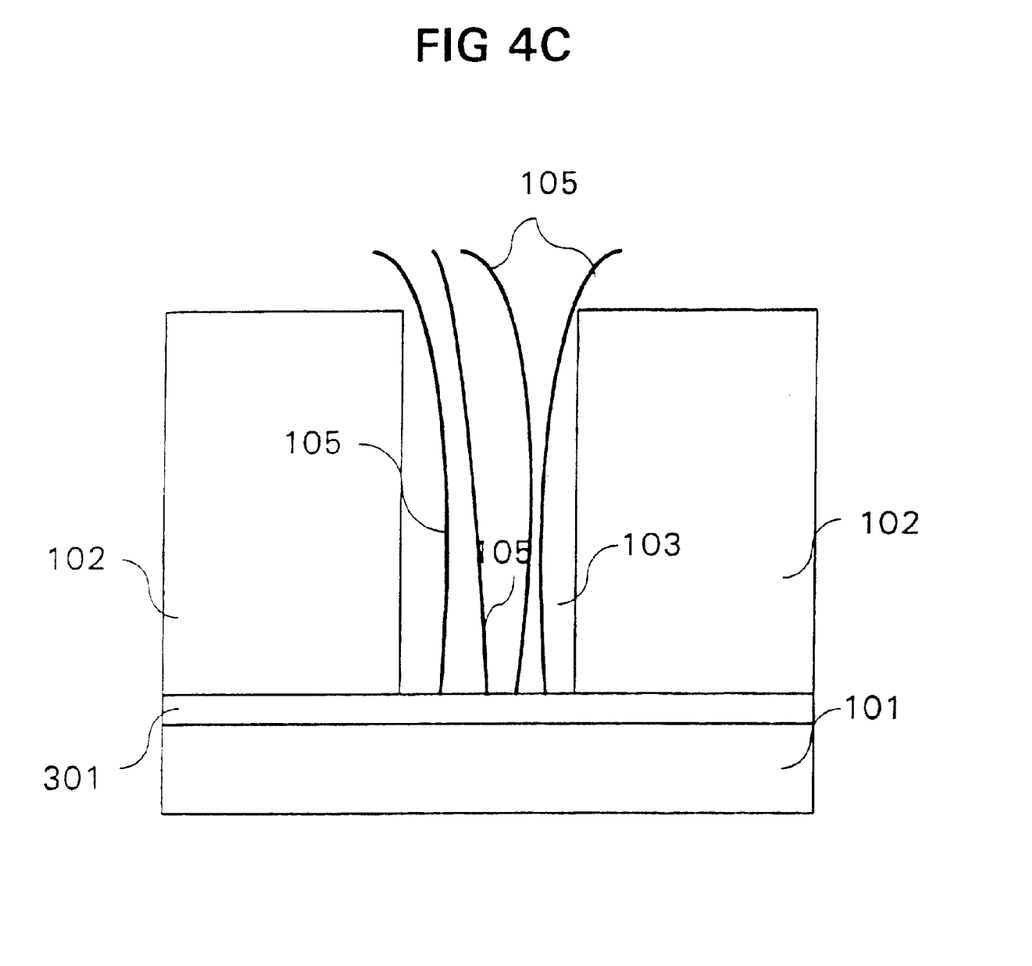

Referring to FIG. 4a to FIG. 4c, the individual method steps involved in the production of the second semiconductor element 300 are explained in more detail below.

First of all, a nucleation layer 301 comprising metal particles (nickel, iron, yttrium, and/or cobalt) is deposited on the first conductive layer 101. The nucleation layer 301 is deposited over the entire surface of the first conductive layer 101 by means of a suitable CVD process, sputtering process or physical vapor deposition process. The nucleation layer 301 has a thickness of 0.1 nm to 50 nm.

The nonconductive layer 102 is deposited on the nucleation layer 301, for example by means of a CVD process (cf. FIG. 4a).

After the hole 103 has been etched into the nonconductive layer 102 down to the surface of the nucleation layer 301, as shown in FIG. 4b, the carbon nanotubes 105 are grown on the nucleation layer 301 using the process described in [2].

The growth is continued until the length of the carbon nanotubes 105 is sufficient for them to project above the surface of the nonconductive layer 102 (cf. FIG. 4c).

In a further step, the second conductive layer 106 is deposited on the nonconductive layer 102 by means of a CVD process.

Once again, the result is a semiconductor element with an electrically conductive connection produced by means of carbon nanotubes between two conductive layers through a contact hole.

EXEMPLARY EMBODIMENT 3

Figure 5:
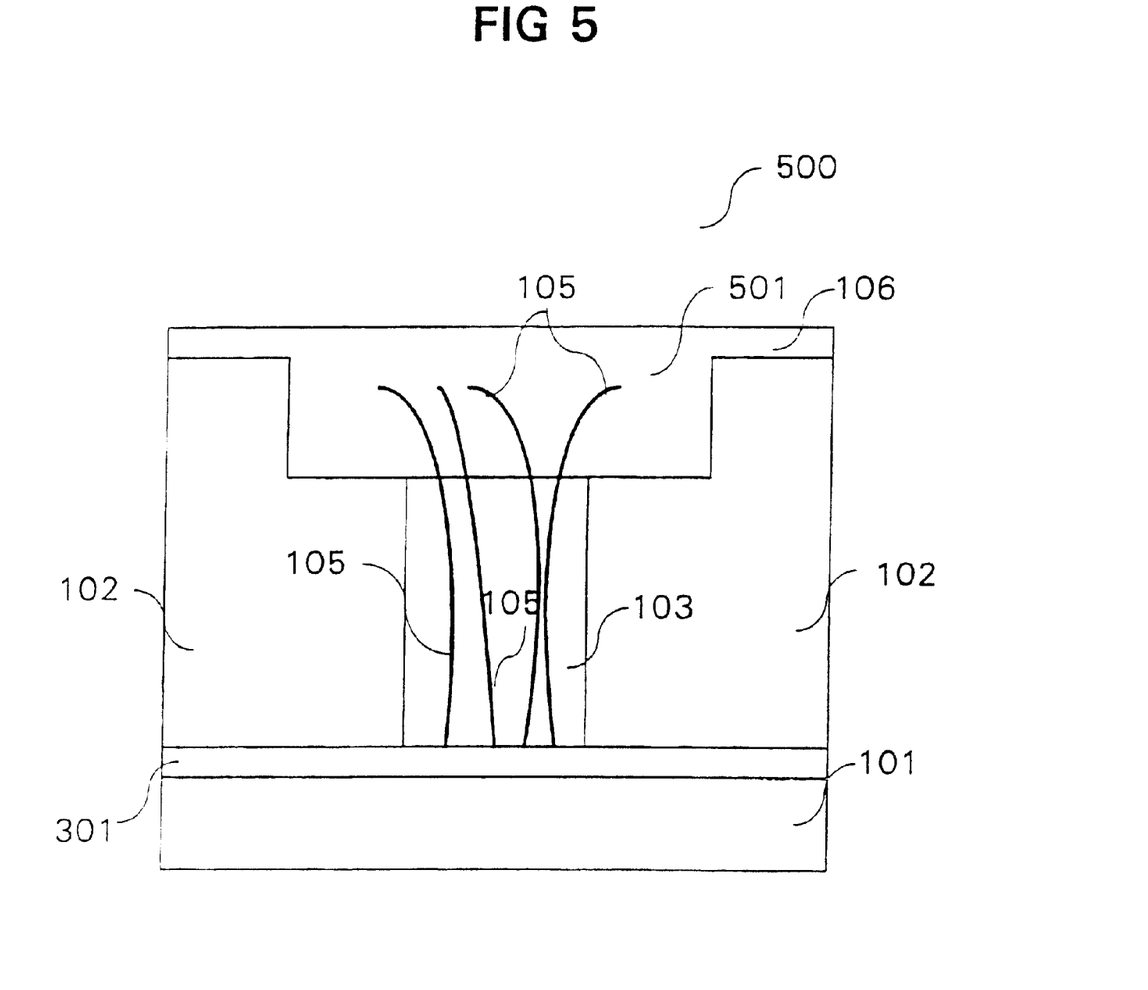
FIG. 5 shows a cross section through a semiconductor element in accordance with a third exemplary embodiment of the invention.

FIG. 5 shows a third semiconductor element 500 in accordance with a third exemplary embodiment.

Identical elements of the semiconductor element are once again provided with the same reference symbols.

The third semiconductor element 500 differs from the second semiconductor 300 substantially only in that a trench 501 is etched into the nonconductive layer 102, and therefore the carbon nanotubes 105 do not project above the surface of the nonconductive layer 102, but rather only above the base of the trench 501, into the nonconductive layer 102.

The individual layers of the third semiconductor element 500 comprise the same materials as the first semiconductor element 100 and the second semiconductor element 300.

The method used to produce the third semiconductor element 500 is explained in detail with reference to FIG. 6a to FIG. 6e.

Figure 6A:
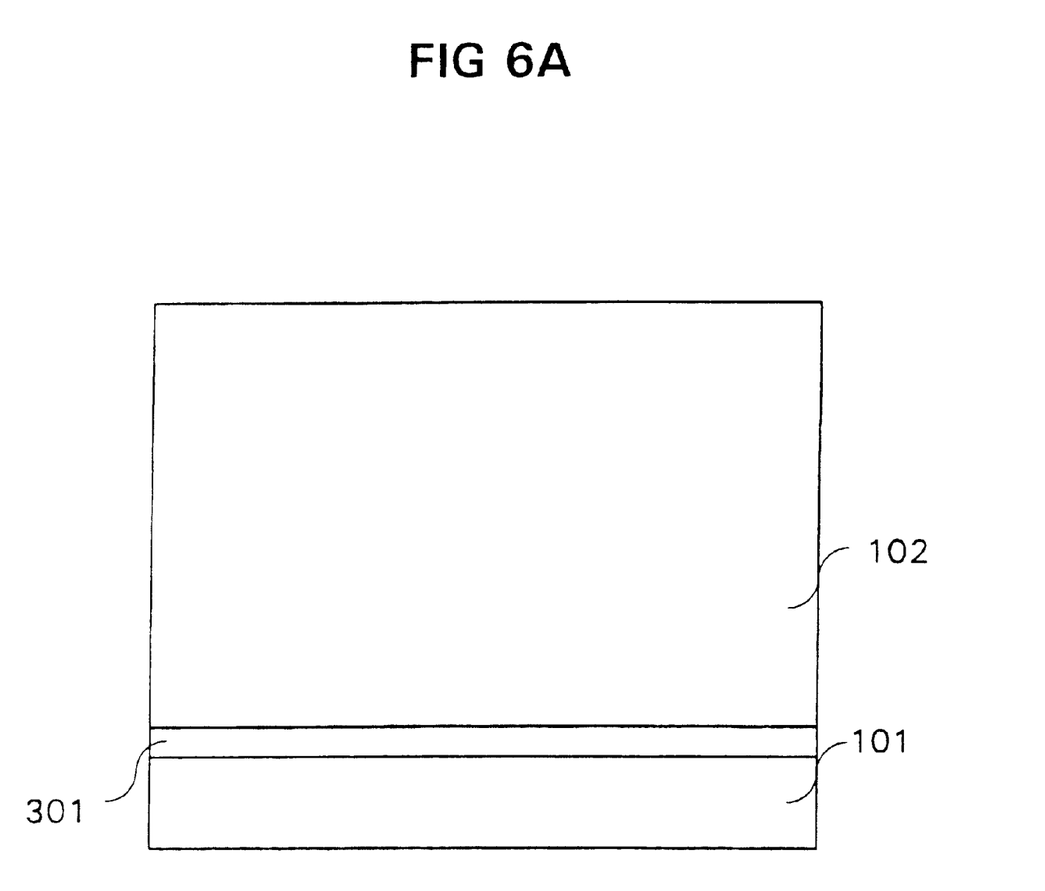
FIGS. 6a to 6e show cross sections through a semiconductor element which are used to explain individual method steps involved in the production of the semiconductor element illustrated in FIG. 5.

As illustrated in FIG. 6a, the nucleation layer 301 is deposited over the first conductive layer 101 in a thickness of 0.1 nm to 50 nm by means of a suitable CVD process, sputtering process or physical vapor deposition process. The nonconductive layer 102 is deposited on the nucleation layer 301 by means of a CVD process.

Figure 6B:
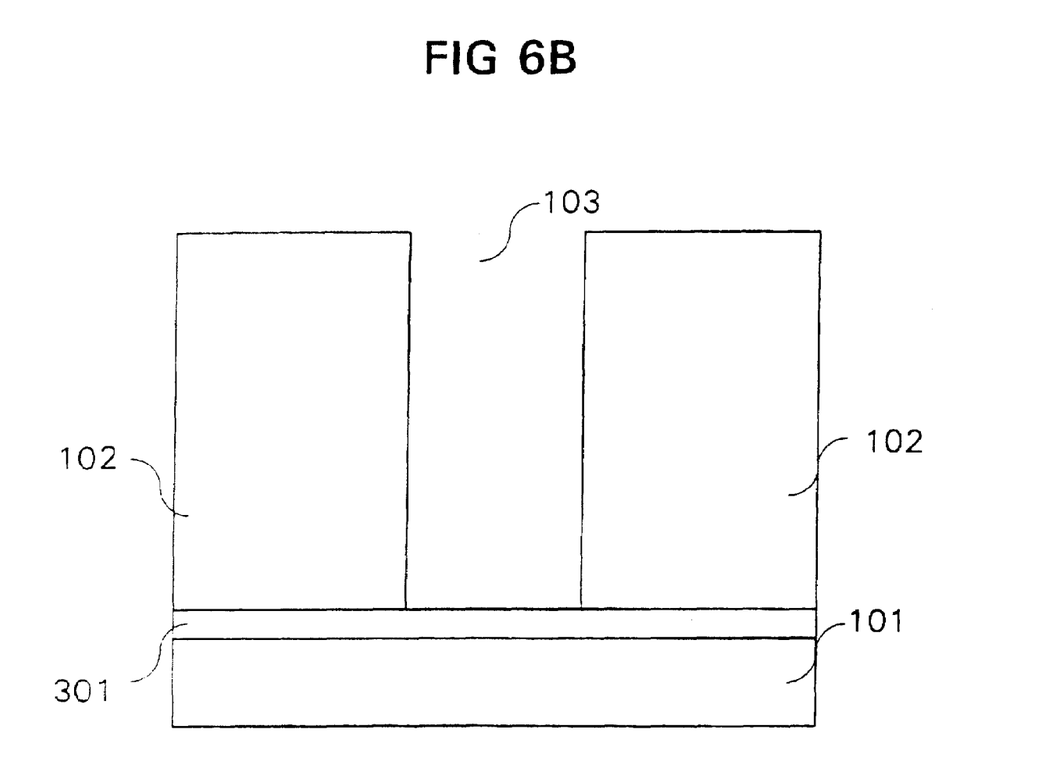

The hole 103 is etched into the nonconductive layer 102 down to the surface of the nucleation layer 301 (cf. FIG. 6b).

Figure 6C:
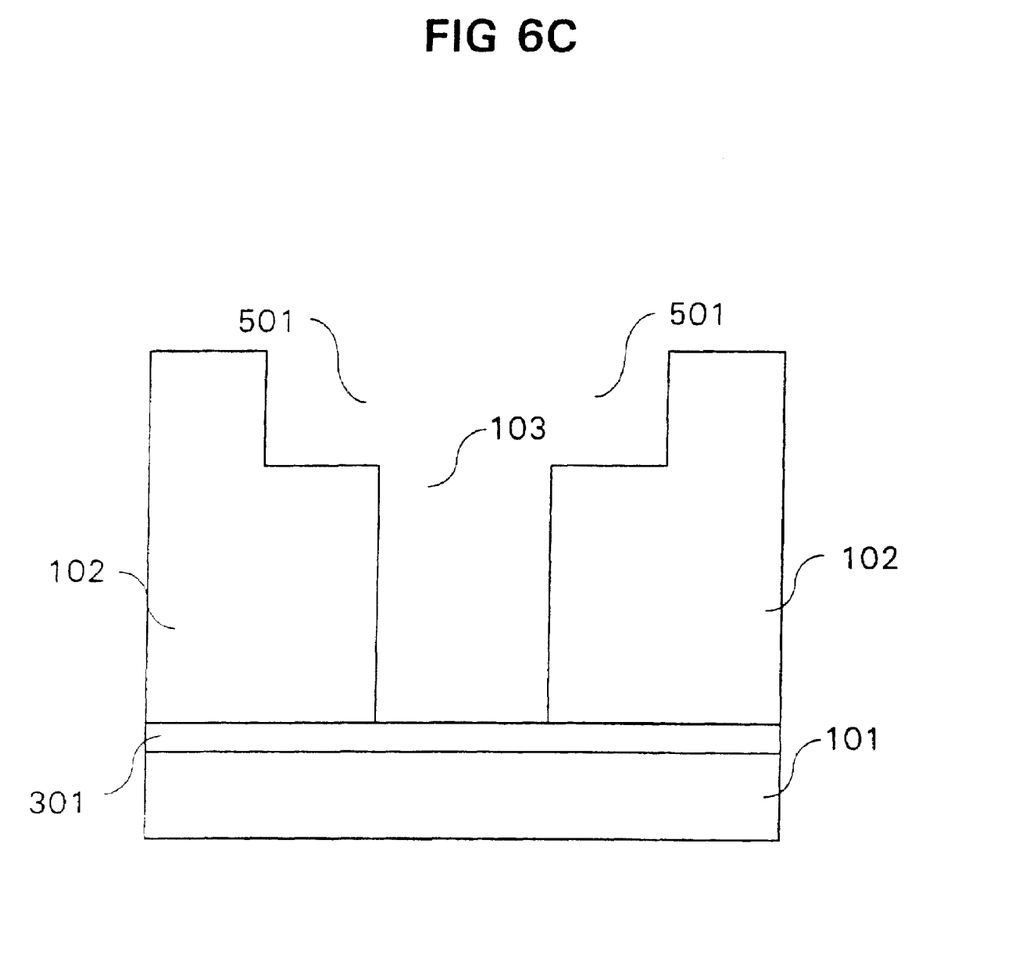

Furthermore, a trench 501 is etched into the nonconductive layer 102 by means of dry-etching or wet-etching (cf. FIG. 6c).

Figure 6D:
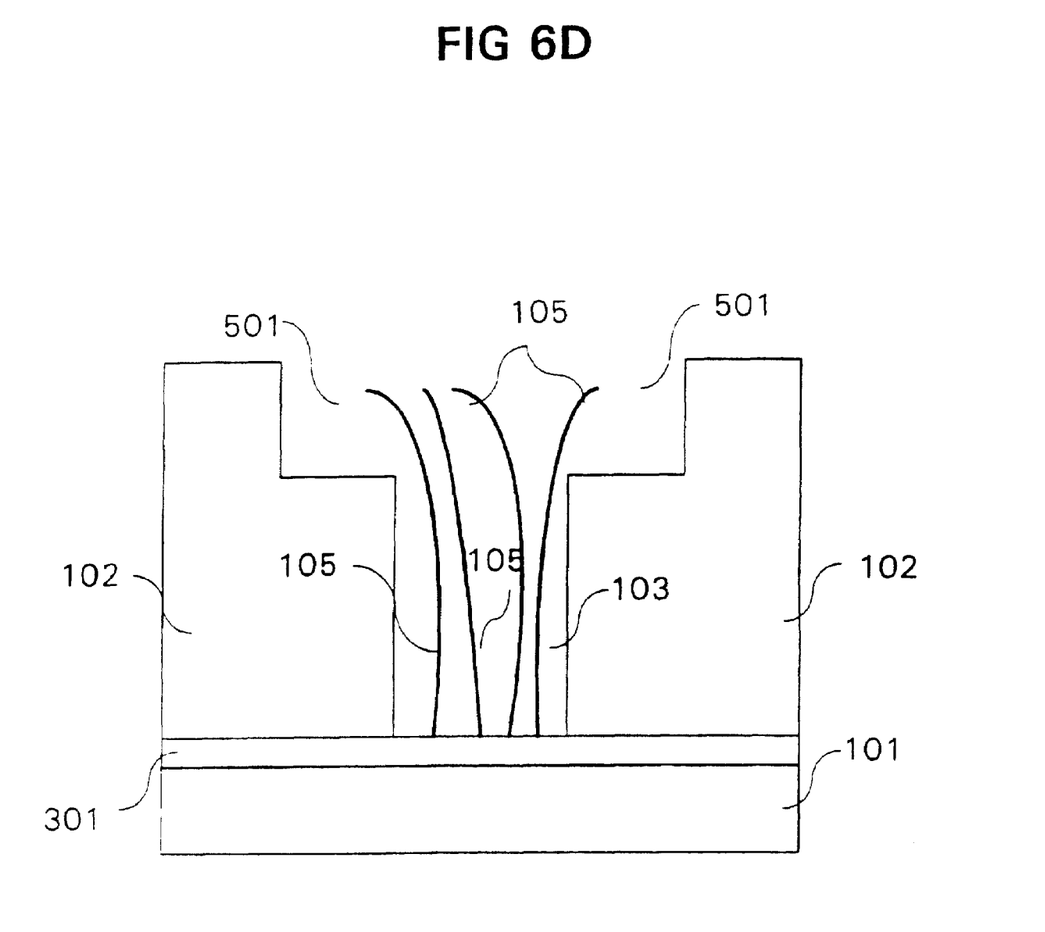

In a further step, the carbon nanotubes 102 are grown on the nucleation layer 301 up to a length which is such that the carbon nanotubes 102 project above the lower surface of the trench 501 but not above the nonconductive layer 102 as a whole (cf. FIG. 6d).

Figure 6E:
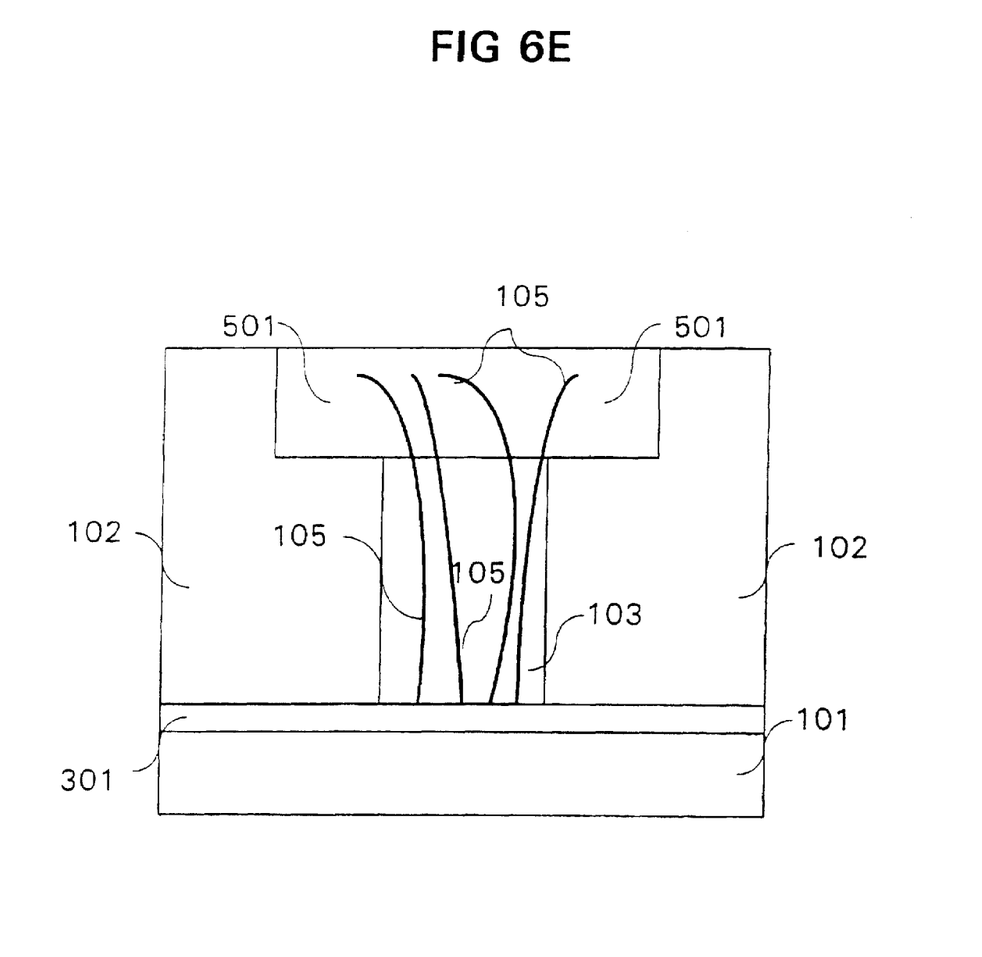

As illustrated in FIG. 6e, in a further method step the second conductive layer 106 is deposited in the trench 501 and on top of the nonconductive layer 102 by means of a CVD process.

The second conductive layer 106 is reduced to a desired thickness by means of a suitable etching process, a chemical mechanical polishing process or by means of ion beam etching, so that the surface of the second conductive layer 106 is planar with the surface of the nonconductive layer 102.

A number of alternatives to the exemplary embodiment presented above are explained below:

The CVD process used may be a CVD process using carbon monoxide CO, methane $CH_4$ or acetylene $C_2H_2$, or a plasma-enhanced CVD process.

Furthermore, it is not necessary for the carbon nanotubes 105 to project above the surface of the nonconductive layer or above the surface of the lower surface of the trench 501. Alternatively, the carbon nanotube 105 can be brought to the required length by chemical mechanical polishing or ion beam etching at an inclined angle (so that the ions cannot penetrate significantly into the contact hole during the ion beam etching), i.e. can be brought to a length which is such that the carbon nanotubes 105 come into contact with at least the second conductive layer 106.

If sections of the carbon nanotubes 105 project beyond the second conductive layer, they can be removed by means of an ashing process, which is required in any case when using a resist mask for the metal etching. The carbon nanotubes may also be brought to the required length by means of an anisotropic plasma etching process, as used, for example, for patterning organic materials.

The invention is not restricted to a three-layer structure. The semiconductor element can be used in any desired semiconductor structure, i.e. it may form a partial semiconductor element of a semiconductor element which comprises a very large number of layers, in order to make contact between two conductive layers in the semiconductor element.

Obviously, the invention is to be regarded as residing in the fact that two electrically conductive layers which are electrically decoupled from one another in a semiconductor element by a nonconductive layer are electrically conductively connected to one another through a contact hole by means of carbon nanotubes.

In this way, a high degree of stability of the semiconductor element is achieved with a minimal deviation from standard production processes for a semiconductor element which are already known.

Moreover, the contact made through contact holes makes it possible to achieve high aspect ratios of up to approximately 1000.

As an alternative, within the context of the invention it is also readily possible for a sputtering process or a physical vapor deposition process to be used instead of the CVD process.

The following publications are cited in this document:
[1] C. Dekker, Carbon Nanotubes as Molecular Quantum Wires, Physics Today, pp. 22-28, May 1999
[2] Jung Sang Suh and Jin Seung Lee, Highly Ordered Two-Dimensional Carbon Nanotubes Areas, Applied Physics Letters, Vol. 75, No. 14, pp. 2047-2049, October 1999

The invention claimed is:

1. An electronic component, comprising:
   a first conductive layer;
   a nonconductive layer on the first conductive layer, the nonconductive layer having a hole through the nonconductive layer;
   a second conductive layer on the nonconductive layer; and
   an electrical connection conductively connecting the first conductive layer and the second conductive layer, which are electrically insulated from one another by the nonconductive layer, wherein the electrical connection is formed by at least one nanotube in the hole, the nanotube being a grown nanotube.

2. The electronic component as claimed in claim 1, in which the nanotube is a carbon nanotube.

3. The electronic component as claimed in claim 1, in which the electrical connection is formed by a plurality of nanotubes present in the hole.

4. The electronic component as claimed in claim 1, having a nucleation layer above the first conductive layer, on which the nanotube is grown.

5. The electronic component as claimed in claim 1, in which the nucleation layer has metal particles which are catalytically active in the growth of the nanotube.

6. The electronic component as claimed in claim 5, in which the metal particles include at least one of the metals selected from the group consisting of Nickel, Iron, Yttrium, Cobalt, and Platinum.

7. The electronic component as claimed in claim 1 wherein the nonconductive layer includes an intermetal dielectric.

8. The electronic component as claimed in claim 1 wherein the first conductive layer and/or the second conductive layer includes metal or a combination of various metals.

9. The electronic component as claimed in claim 8, in which the first conductive layer and/or the second conductive layer includes a material selected from the group consisting of copper, aluminum, and a combination of Ta, TaN, Ti, TiN.

10. The electronic component as claimed in claim 1 wherein the electronic component is a semiconductor component.

* * * * *